(12) United States Patent
Venkatraman et al.

(10) Patent No.: US 9,006,821 B2
(45) Date of Patent: Apr. 14, 2015

(54) ELECTRONIC DEVICE COMPRISING A CONDUCTIVE STRUCTURE AND AN INSULATING LAYER WITHIN A TRENCH

(71) Applicant: Semiconductor Components Industries, LLC, Phoenix, AZ (US)

(72) Inventors: Prasad Venkatraman, Gilbert, AZ (US); Gordon M. Grivna, Mesa, AZ (US); Gary H. Loechelt, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/171,427

(22) Filed: Feb. 3, 2014

(65) Prior Publication Data

US 2014/0145256 A1 May 29, 2014

Related U.S. Application Data

(62) Division of application No. 13/327,361, filed on Dec. 15, 2011, now Pat. No. 8,679,919.

(51) Int. Cl.
*H01L 29/78* (2006.01)
*H01L 29/40* (2006.01)
*H01L 29/66* (2006.01)
*H01L 21/28* (2006.01)
(Continued)

(52) U.S. Cl.
CPC .......... *H01L 29/7827* (2013.01); *H01L 29/407* (2013.01); *H01L 29/66659* (2013.01); *H01L 29/66689* (2013.01); *H01L 29/66696* (2013.01); *H01L 29/7816* (2013.01); *H01L 29/7835* (2013.01); *H01L 21/2815* (2013.01); *H01L 29/41766* (2013.01); *H01L 29/42376* (2013.01); *H01L 29/0634* (2013.01)

(58) Field of Classification Search
USPC ......... 257/118, 244, 328–333, 466, 513, 594, 257/E29.262, E21.41
See application file for complete search history.

(56) References Cited

U.S. PATENT DOCUMENTS 5,569,949 A 10/1996 Malhi
5,667,632 A 9/1997 Burton et al.
(Continued)

OTHER PUBLICATIONS

Wolf, Stanley et al., "Silicon Processing for the VLSI Era," vol. 1: Process Technology, Copyright 1986 Lattice Press, 1986, 4 pgs.

*Primary Examiner* — Mamadou Diallo
(74) *Attorney, Agent, or Firm* — Abel Law Group, LLP

(57) ABSTRACT

An electronic device can include a semiconductor layer overlying a substrate and having a primary surface and a thickness, wherein a trench extends through at least approximately 50% of the thickness of semiconductor layer to a depth. The electronic device can further include a conductive structure within the trench, wherein the conductive structure extends at least approximately 50% of the depth of the trench. The electronic device can still further include a vertically-oriented doped region within the semiconductor layer adjacent to and electrically insulated from the conductive structure; and an insulating layer disposed between the vertically-oriented doped region and the conductive structure. A process of forming an electronic device can include patterning a semiconductor layer to define a trench extending through at least approximately 50% of the thickness of the semiconductor layer and forming a vertically-oriented doped region after patterning the semiconductor layer to define the trench.

20 Claims, 8 Drawing Sheets

(51) Int. Cl.
  *H01L 29/417* (2006.01)
  *H01L 29/423* (2006.01)
  *H01L 29/06* (2006.01)

(56) References Cited

U.S. PATENT DOCUMENTS

| | | | |
|---|---|---|---|
| 6,084,268 A | 7/2000 | de Frésart et al. | |
| 6,501,129 B2 * | 12/2002 | Osawa | 257/330 |
| 6,545,316 B1 | 4/2003 | Baliga | |
| 6,649,975 B2 | 11/2003 | Baliga | |
| 7,276,747 B2 | 10/2007 | Loechelt et al. | |
| 7,345,342 B2 | 3/2008 | Challa et al. | |
| 7,847,350 B2 | 12/2010 | Davies | |
| 7,868,379 B2 | 1/2011 | Loechelt | |
| 7,902,017 B2 | 3/2011 | Loechelt | |
| 7,902,601 B2 | 3/2011 | Loechelt et al. | |
| 7,989,857 B2 | 8/2011 | Loechelt | |
| 8,076,716 B2 | 12/2011 | Loechelt | |
| 8,202,775 B2 | 6/2012 | Loechelt | |
| 8,298,886 B2 | 10/2012 | Loechelt et al. | |
| 8,519,474 B2 | 8/2013 | Loechelt | |
| 8,541,302 B2 | 9/2013 | Loechelt et al. | |
| 8,592,279 B2 | 11/2013 | Loechelt | |
| 2006/0049455 A1 | 3/2006 | Jang et al. | |
| 2006/0214222 A1 | 9/2006 | Challa et al. | |
| 2009/0212357 A1 | 8/2009 | Risaki | |
| 2010/0090269 A1 | 4/2010 | Davies | |
| 2010/0140693 A1 * | 6/2010 | Hebert | 257/333 |
| 2011/0045664 A1 | 2/2011 | Davies | |
| 2011/0193160 A1 | 8/2011 | Loechelt et al. | |
| 2013/0153987 A1 | 6/2013 | Venkatraman et al. | |
| 2013/0153991 A1 | 6/2013 | Loechelt et al. | |
| 2013/0153992 A1 | 6/2013 | Loechelt | |

* cited by examiner

ELECTRONIC DEVICE COMPRISING A CONDUCTIVE STRUCTURE AND AN INSULATING LAYER WITHIN A TRENCH

RELATED APPLICATION

This is a divisional of and claims priority under 35 U.S.C. §120 to U.S. patent application Ser. No. 13/327,361 entitled "Electronic Device Comprising a Conductive Structure and an Insulating Layer within a Trench and a Process of Forming the Same" by Venkatraman et al. on Dec. 15, 2011, now allowed, which is assigned to the current assignee hereof and incorporated herein by reference in its entirety.

FIELD OF THE DISCLOSURE

The present disclosure relates to electronic devices and processes of forming electronic devices, and more particularly to, electronic devices including trenches and conductive structures therein and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

In optimizing the performance of a MOSFET, a designer is often faced with trade-offs in device parameter performance. Specifically, available device structure or fabrication process choices may improve one device parameter, but at the same time such choices may degrade one or more other device parameters. For example, available structures and processes that improve on resistance times area ($R_{DSON}*A$) of a MOSFET may reduce the breakdown voltage ($BV_{DSS}$) and increase parasitic capacitance between regions within the MOSFET. Further, figure of merit is a product of $R_{DSON}$ and gate charge, and skilled artisans appreciate that lowering both $R_{DSON}$ and gate charge can be difficult.

BRIEF DESCRIPTION OF THE DRAWINGS

Embodiments are illustrated by way of example and are not limited in the accompanying figures.

Figure 1:
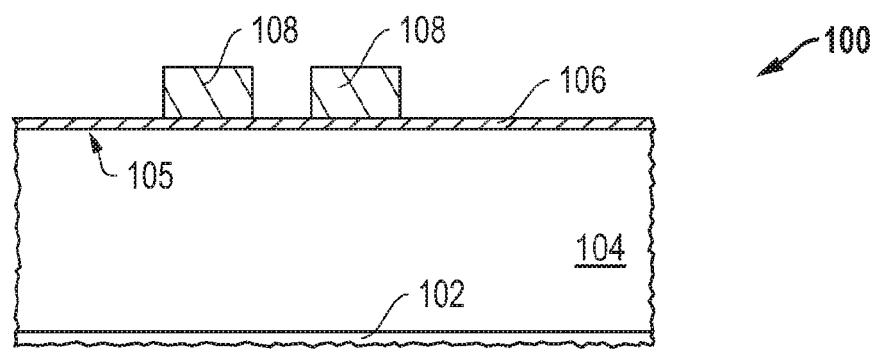
FIG. 1 includes an illustration of a cross-sectional view of a portion of a workpiece that includes an underlying doped region, a semiconductor layer, a pad layer, and a patterned stopping layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the term "channel length" is intended to mean the distance between a source region and a drain region of a transistor that is measured substantially parallel to the current flow through a channel region during normal operation.

The terms "horizontally-oriented" and "vertically-oriented," with respect to a region or structure, refers to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a transistor structure having a lateral channel region and a vertically-oriented doped region on a drain side of the channel region adjacent to a trench. A conductive structure within a trench can help deplete the drain side of the channel region. A thicker portion of an insulating layer can allow for reduced capacitive coupling between an underlying doped region and conductive structures within the trench. Further, the formation of the transistor structure can leverage self-aligned processing and reduce potential misalignment errors. Accordingly, features do not need to be as large to account for potential misalignment, and the transistor cell may have a smaller pitch. Such an electronic device may have a smaller $R_{DSON}$*Area and a lower figure of merit, which is a product of $R_{DSON}$ times the gate charge, as compared to other electronic devices operating at the same gate and drain voltages. Therefore, the performance of the electronic device is significantly improved. In an alternative embodiment, another conductive structure can be disposed within another trench on a source side of the channel. In a further embodiment, a superjunction can be used. While many features are addressed above and described below, such features should not construed as essential or critical, as particular embodiments may not have such features.

FIG. 1 includes an illustration of a cross-sectional view of a portion of a workpiece 100. The workpiece 100 includes an underlying doped region 102 that is part of a substrate that may be lightly doped or heavily doped, n-type or p-type. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$. The underlying doped region 102 can be a portion of a heavily doped substrate (e.g., a heavily n-type doped wafer) or may be a buried doped region overlying a base layer of opposite conductivity type or overlying a buried insulating layer (not illustrated) that lies between the base layer and the buried doped region. In a particular embodiment, the underlying doped region 102 can include a lightly doped portion overlying a heavily doped portion, for example when an overlying semiconductor layer 104 has an opposite conductivity type, to help increase the junction breakdown voltage. In an embodiment, the underlying doped region 102 is heavily doped with an n-type dopant, such as phosphorus, arsenic, antimony, or any combination thereof. In a particular embodiment, the underlying doped region 102 includes arsenic or antimony if diffusion of the underlying doped region 102 is to be kept low, and in a particular embodiment, the underlying doped region 102 includes antimony to reduce the level of outgassing (as compared to arsenic) during formation of the semiconductor layer 104.

In the embodiment illustrated in FIG. 1, the semiconductor layer 104 overlies the underlying doped region 102 and can include a Group 14 element (i.e., carbon, silicon, germanium, or any combination thereof) and any of the dopants as described with respect to the underlying doped region 102 or dopants of the opposite conductivity type. In an embodiment, the semiconductor layer 104 is a lightly doped n-type or p-type epitaxial silicon layer having a thickness in a range of approximately 0.5 microns to approximately 5.0 microns, and a doping concentration no greater than approximately $10^{17}$ atoms/cm$^3$, and in another embodiment, a doping concentration of least approximately $10^{14}$ atoms/cm$^3$. The doping concentration of the semiconductor layer 104 at this point in the process flow may be referred to as the background doping concentration. The semiconductor layer includes a primary surface 105 that is spaced apart from underlying doped region 102. In another embodiment, the semiconductor layer 104 can include a relatively heavier doped region adjacent to the underlying doped region and a relatively lighter doped region over the relatively heavier doped region. The relatively heavier doped region may have a dopant concentration in a range of approximately $1 \times 10^{17}$ atoms/cm$^3$ to approximately $5 \times 10^{17}$ atoms/cm$^3$, and the relatively lighter doped region may have a dopant concentration no greater than approximately $5 \times 10^{16}$ atoms/cm$^3$. Alternatively, the semiconductor layer 104 may have a graded dopant concentration that is relatively heavier near the underlying doped region and relatively lighter closer to the primary surface 105. The semiconductor layer 104 may be epitaxially grown from the underlying doped region 102.

A pad layer 106 and a stopping layer 108 (e.g., a polish-stop layer or an etch-stop layer) are formed over the semiconductor layer 104 using a thermal growth technique, a deposition technique, or a combination thereof. Each of the pad layer 106 and the stopping layer 108 can include an oxide, a nitride, an oxynitride, or any combination thereof. In an embodiment, the pad layer 106 has a different composition as compared to the stopping layer 108. In a particular embodiment, the pad layer 106 includes an oxide, and the stopping layer 108 includes a nitride. The pad layer 106 is relatively thin, and the stopping layer 108 is relatively thick. The height of subsequently-formed gate members may be affected by the thickness of the stopping layer 108. The pad layer 106 can have a thickness in a range of approximately 2 to approximately 30 nm. In an embodiment, the stopping layer 108 has a thickness in a range of approximately 500 nm to approximately 2000 nm. As illustrated in FIG. 1, the stopping layer 108 is patterned. The widths of the members of the stopping layer 108 may be no greater than approximately 0.9 micron, no greater than approximately 0.7 micron, or no greater than approximately 0.5 micron.

Figure 2:
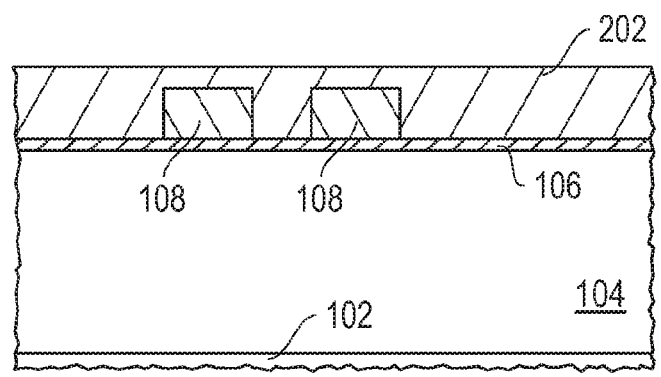
FIG. 2 includes an illustration of a cross-sectional view of the workpiece of FIG. 1 after forming a planarized insulating layer.

In FIG. 2, an insulating layer 202 is deposited over the pad layer 106 and the stopping layer 108. The insulating layer 202 can include an oxide, a nitride, an oxynitride, or any combination thereof. In an embodiment, the insulating layer 202 has a different composition as compared to the stopping layer 108. In a particular embodiment, the insulating layer 202 includes an oxide. The insulating layer 202 can be deposited to a thickness at least at thick as the stopping layer 108. In an embodiment, the insulating layer 202 has a thickness in a range of approximately 800 nm to approximately 2500 nm. The insulating layer 202 can be planarized using an etchback or polishing technique. The planarization is performed to remove a portion or all of the insulating layer 202 from over the stopping layer 108. In an embodiment, a portion of the insulating layer 202 remains over the stopping layer 108 and has a thickness to substantially protect the stopping layer 108 during a subsequent trench etch. In a particular embodiment, over the stopping layer 108, the insulating layer 202 has a thickness in a range of approximately 100 nm to approximately 500 nm. In still a further embodiment (not illustrated), the planarization can be performed and use the stopping layer 108 for endpoint detection, followed by a deposition of a material similar to the insulating layer 202 to achieve a desired thickness of material over the stopping layer 108.

Figure 3:
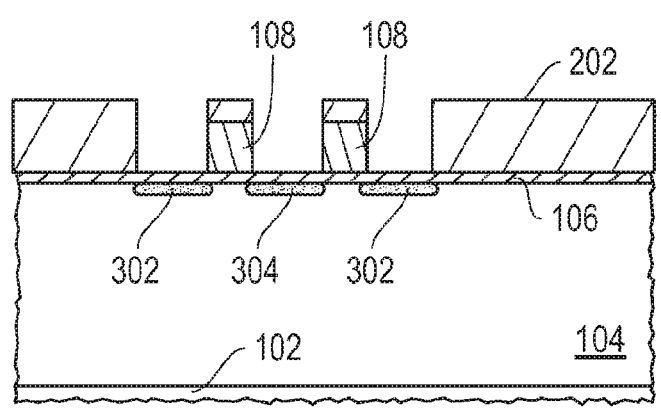
FIG. 3 includes an illustration of a cross-sectional view of the workpiece of FIG. 2 after patterning the planarized insulating layer and forming lightly doped drain regions.

FIG. 3 includes an illustration of a cross-sectional view after patterning the insulating layer 202 and forming doped regions 302 and 304. The width of the openings in the insulating layer 202 and each of the doped regions 302 and 304 may be no greater than approximately 1.5 microns, no greater than approximately 0.9 micron, or no greater than approximately 0.7 micron. In an embodiment, the pad layer 106 may not be significantly etched during the patterning of the insulating layer 202. In another embodiment, the pad layer 106 within the openings is removed and another layer having a similar composition and thickness as the pad layer 106 can be formed. The pad layer 106 or the other layer can be an implant screen to reduce the effects of implant channeling.

The doped region 302 can be a lightly doped drain (LDD) region for the drain region of the transistor being formed. The doped regions 302 and 304 may be n-type doped or p-type doped depending on whether the transistor is an n-channel transistor or a p-channel transistor. In an embodiment, the peak dopant concentration of the doped regions 302 and 304 is at least approximately $1 \times 10^{16}$ atoms/cm$^3$, or at least approximately $2 \times 10^{16}$ atoms/cm$^3$, and in another embodiment, the dopant concentration may be no greater than approximately $8 \times 10^{17}$ atoms/cm$^3$ or no greater than approximately $2 \times 10^{17}$ atoms/cm$^3$. In an embodiment, the depth of the doped regions 302 and 304 can be at least approximately 0.05 micron or at least approximately 0.11 micron, and in another embodiment, the depth of the doped regions 302 and 304 may be no greater than approximately 0.4 micron or no greater than approximately 0.3 micron. In a non-limiting embodiment, $^{31}$P$^+$ ions can be implanted at an energy in a range of approximately 20 keV to approximately 160 keV to a dose in a range of approximately $5 \times 10^{11}$ ions/cm$^2$ to approximately $8 \times 10^{12}$ ions/cm$^2$. If another dopant species is used, the energy can be adjusted so that the projected range of the implant into the semiconductor layer 104 is substantially the same.

Figure 4:
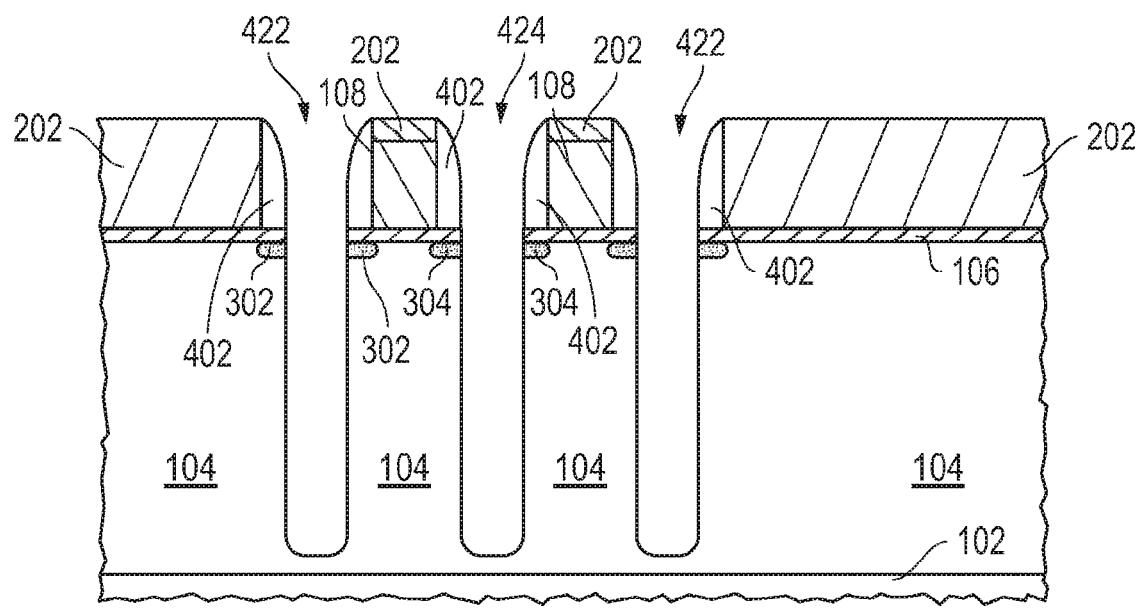
FIG. 4 includes an illustration of a cross-sectional view of the workpiece of FIG. 3 after forming trenched extending into a semiconductor layer towards the underlying doped region.

In FIG. 4, sidewall spacers 402 are formed, and the semiconductor layer 104 is etched to form trenches 422 and 424. An insulating layer for the sidewall spacers 402 can be deposited over the insulating layer 202 and within the openings in the insulating layer 202. In a particular embodiment, the insulating layer is conformally deposited. The insulating layer for the sidewall spacers 402 can include any of the materials as described with respect to the insulating layer 202. The insulating layer for the sidewall spacers 402 can have substantially the same or a different composition as compared to the insulating layer 202. The thickness of the insulating layer for the sidewall spacers 402 can determine how much of the doped regions 302 and 304 extend outside of the subsequently-formed trenches 422 and 424. In an embodiment, the thickness of the insulating layer is at least approximately 50 nm or at least approximately 110 nm, and in another embodiment, the thickness of the insulating layer may be no greater than approximately 300 nm or no greater than approximately 200 nm. The insulating layer can be anisotropically etched to form the sidewall spacers 402. The width of the sidewall spacers 402 at their bases corresponds to the thickness of the insulating layer that was deposited.

The semiconductor layer 104 is etched to define the trenches 422 and 424. The trenches 422 and 424 extend through at least approximately 50%, at least approximately 70%, at least approximately 90%, or substantially all of the thickness of the semiconductor layer 104. Other than rounding near the bottom of the trenches 422 and 424, the trenches 422 and 424 may have substantially uniform widths. The bottom of the trenches 422 and 424 can have a relatively flat bottom and rounded corners, as illustrated in FIG. 4, or may have a substantially rounded bottom (that is, substantially U-shaped), not illustrated. The widths of the trenches 422 and 424 can be wide enough such that a subsequently-formed insulating layer does not completely fill the openings and not so wide that a combination of subsequently-formed insulating and conductive layers do not completely fill the trenches 422 and 424. In an embodiment, the widths of the trenches 422 and 424 can be at least approximately 0.1 micron or at least approximately 0.2 micron, and in another embodiment, the widths of the trenches may be no greater than approximately 0.7 micron or no greater than approximately 0.5 micron.

Figure 5:
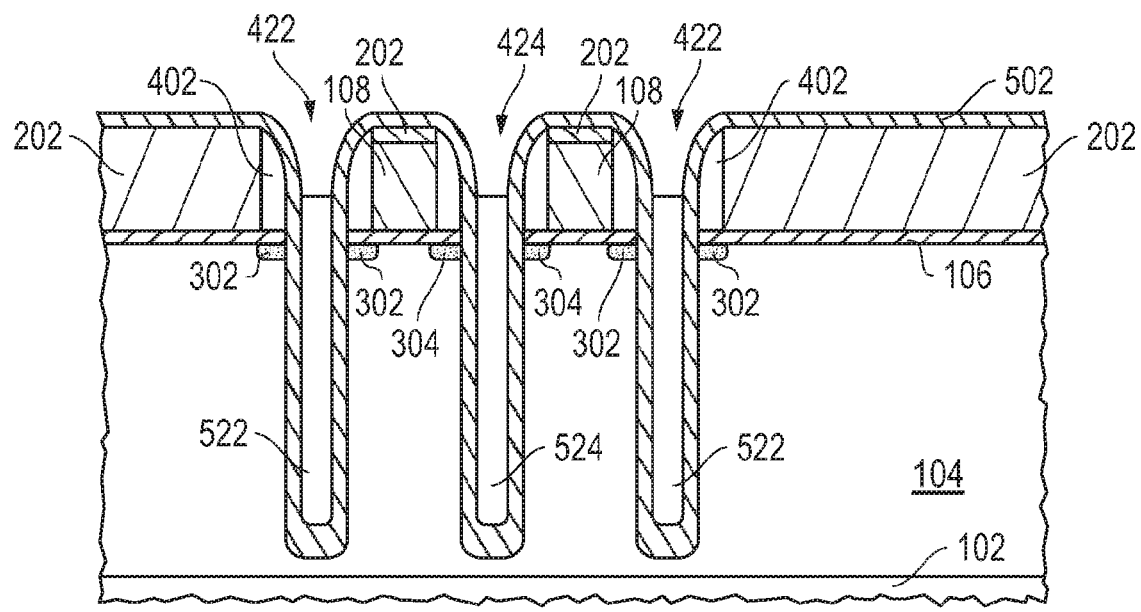
FIG. 5 includes an illustration of a cross-sectional view of the workpiece of FIG. 4 after forming an insulating layer and conductive structures within the trench.

In FIG. 5, an insulating layer 502 and conductive structures 522 and 524 are formed. The insulating layer 502 is formed over the insulating layer 202, the sidewall spacers 402, and within the trenches 422 and 424. The insulating layer 502 electrically insulates the conductive structures 522 and 524 from the semiconductor layer 104 and underlying doped region 102. The insulating layer 502 can include any of the materials as described with respect to the insulating layer 202. The insulating layer 502 can have substantially the same or a different composition as compared to the insulating layer 202. The insulating layer 502 can include a single film or a plurality of films. When the insulating layer 502 includes a plurality of films, one of the insulating films may be selectively etched in preference to another insulating film within the insulating layer 502. In a particular embodiment, a portion of the insulating layer 502 can be a thermally grown oxide along the sidewalls of the trenches 422 and 424, and then an oxide can be deposited. Deposited oxides, and in particular doped deposited oxides, have a substantially higher etch rate as compared to thermal oxide in the presence of a wet oxide etchant. In an embodiment, the insulating layer 502 may extend to the underlying doped region 102. In a particular embodiment, the thickness of the insulating layer 502 can be selected based on a desired drain-to-source breakdown voltage, $BV_{DSS}$ of the transistor structure, and the particular composition of the insulating layer 502. As a non-limiting example, a transistor structure designed with a 30V $BV_{DSS}$ may have approximately 100 nm of oxide, while a transistor structure designed with a 60V $BV_{DSS}$ may have approximately 200 nm to 250 nm of oxide. In another embodiment (not illustrated), the thickness of insulating layer 502 can be made thicker at the bottom of the trench 422 to decrease the capacitance between the underlying doped region 102, and a subsequently deposited conductive layer in the trench 422.

A conductive layer is formed over the insulating layer 502 and within the trenches 422 and 424. The conductive layer substantially fills the trenches 422 and 424. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN; and the conductive fill material can include tungsten. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

A portion of the conductive layer that overlies the insulating layer 502 is removed to form conductive structures 522 and 524 within the trenches 422 and 424, as illustrated in the embodiment of FIG. 5. The removal can be performed using a chemical-mechanical polishing or blanket etching technique. The insulating layer 502 may be used as a polish-stop or etch-stop layer. Polishing or etching may be continued after the stopping layer 502 is exposed to recess the conductive structures 522 and 524, such that the tops of the conductive structures 522 and 524 are disposed between the sidewall spacers 402.

Figure 6:
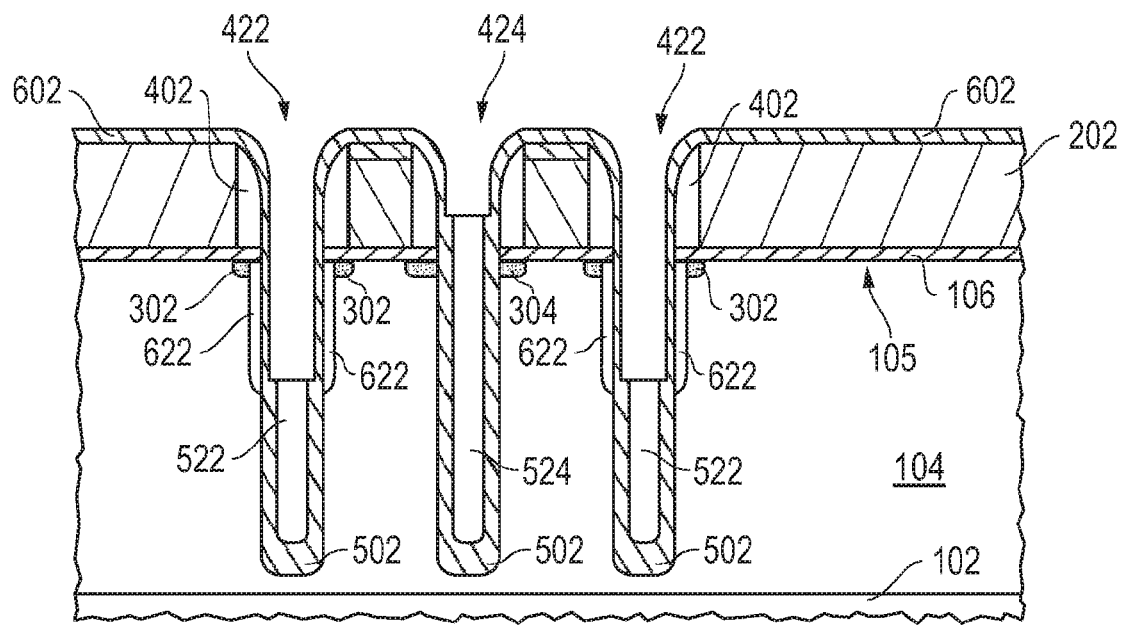
FIG. 6 includes an illustration of a cross-sectional view of the workpiece of FIG. 5 after removing a portion of a conductive structure and forming vertically-oriented doped regions within the semiconductor layer along sidewalls of the trench.

In FIG. 6, the conductive structure 522 is further recessed into the trench 422, a portion of the insulating layer 502 is removed, and vertically-oriented doped regions 622 are formed. A patterned resist layer (not illustrated) is formed over the insulating layer 502. The patterned resist layer is disposed over the conductive structure 524, and the patterned resist layer defines an opening that overlies the conductive structure 522. The conductive structure 522 is etched to further recess the conductive structure 522 within the trench 422. In an embodiment, the conductive structure 522 may recessed to a depth at least approximately 0.5 micron or at least approximately 0.9 micron below the primary surface 105. The maximum normal operating voltage may affect an upper limit for the depth. In a non-limiting example, when the maximum operating voltage is approximately 30 V, the depth may be no greater than approximately 1 microns below the primary surface 105, and when the maximum operating voltage is approximately 100 V, the depth may be no greater than approximately 3 microns below the primary surface 105. The patterned resist layer is removed, and the portion of the insulating layer 502 is etched, such that an insulating portion 602 of the insulating layer 502 remains. The portions of the insulating layer 502 that are disposed between the semiconductor layer 104 and the conductive structures 522 and 524 are not significantly etched. The relatively thinner portions 602 of the insulating layer help to enhance the depletion of the drain, and allow a heavier dopant concentration to be used for the portion of the semiconductor layer 104 between the trenches 422 and 424 and adjacent to the primary surface 105.

In the embodiment illustrated in FIG. 6, vertically-oriented doped regions 622 are formed within the semiconductor layer 104 along sidewalls of the trench 422. The vertically-oriented doped regions 622 have the same conductivity type as the doped region 302 and the underlying doped region 102. As illustrated, the vertically-oriented doped regions 622 are immediately adjacent to the primary surface 105 and the sidewall of the trench 422. The depth of the vertically-oriented doped regions 622 can be controlled by how far the conductive structure 522 is recessed or the implant angle when the vertically-oriented doped regions 622 are formed using ion implantation. The vertically-oriented doped regions 622 can extend to a depth that is at least approximately 20% or at least approximately 40% of thickness of the semiconductor layer 104. The actual percentage may depend in part on the dopant concentration or profile within the semiconductor layer 104. In a non-limiting example, for a relatively lightly doped semiconductor layer 104 with no relatively heavier doped epitaxial layer below, the doped region 622 may extend to the underlying doped region 102. In another non-limiting example where the semiconductor layer 104 includes a relatively heavier doped epitaxial layer, the doped region 622 may extend only part way to the relatively heavier doped epitaxial layer of the semiconductor layer 104.

The lateral dimensions of doped regions are measured in a direction parallel to the primary surface. The doped region 302 extends laterally further from the sidewall of the trench 422 as compared to the vertically-oriented doped regions 622. The vertically-oriented doped regions 622 do not extend into the channel region of the transistor structure. In an embodiment, the vertically-oriented doped regions 622 can extend in a range of approximately 0.1 micron to approximately 0.5 micron from the sidewalls of the semiconductor layer 104 at the trench 422. In a particular embodiment, the doped region 302 may not be formed when the vertically-oriented regions 622 are present.

The dopant concentrations of the vertically-oriented doped regions 622 can be selected to improve on-resistance ($R_{DSON}$) while still providing an acceptable electrical field such that the drain-to-source breakdown voltage ($BV_{DSS}$) is not too low. In an embodiment, the dopant concentration of the vertically-oriented doped region is at least approximately $5\times10^{16}$ atoms/cm$^3$ or at least approximately $7\times10^{16}$ atoms/cm$^3$, and in another embodiment, the dopant concentration is no greater than approximately $8\times10^{17}$ atoms/cm$^3$ or no greater than approximately $2\times10^{17}$ atoms/cm$^3$. In a non-limiting embodiment, $^{31}P^+$ ions can be implanted at an energy in a range of approximately 40 keV to approximately 350 keV to a dose in a range of approximately $2\times10^{12}$ ions/cm$^2$ to approximately $5\times10^{13}$ ions/cm$^2$ using an implant angle of approximately 10° to approximately 30°, as measured from a line perpendicular to the primary surface 105. The energy and implant angle affect the lateral dimension of the doped regions 622. In another embodiment, $^{75}$As$^+$ ions may be implanted. The dose will be approximately the same, and the energy for the $^{75}$As$^+$ implant can be selected to give approximately the same projected range (R$_P$) as the $^{31}$P$^+$ implant.

Figure 7:
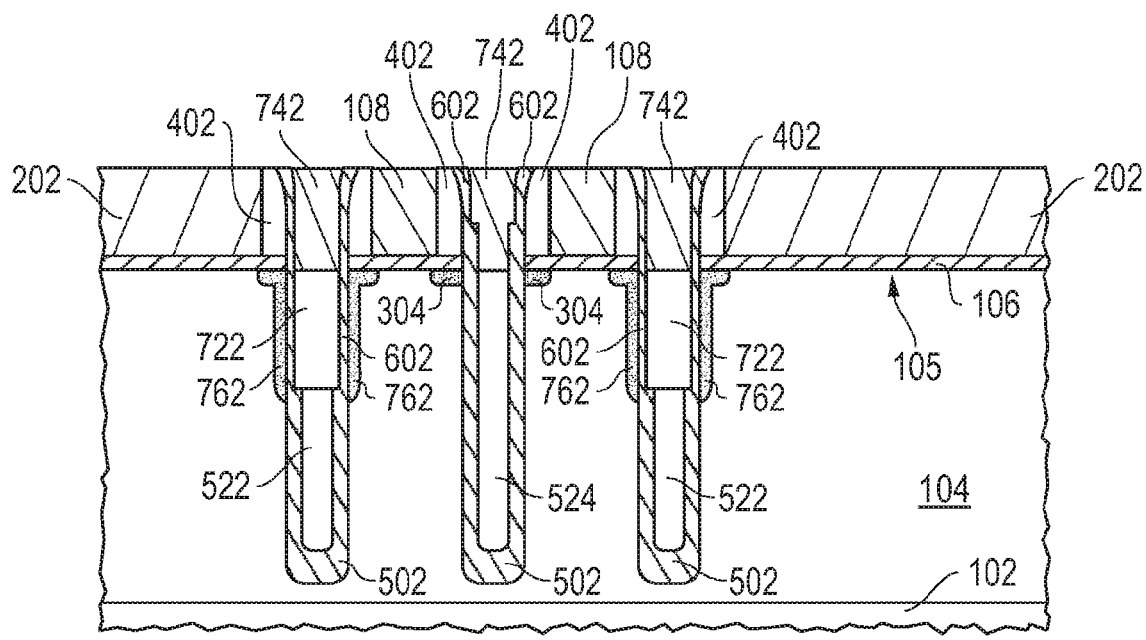
FIG. 7 includes an illustration of a cross-sectional view of the workpiece of FIG. 6 after forming portions of conductive structures and insulating plugs.

FIG. 7 includes an illustration of a cross-sectional view after forming conductive structure 722 and filling the openings above the conductive structures 524 and 722 with insulating plugs 742. The combination of the doped region 302 and vertically-oriented doped regions 622, as illustrated in FIG. 6 are represented in FIG. 7 and subsequent figures by doped regions 762.

A conductive layer is formed over the insulating portion 602 and insulating layer 202 and within the trenches 422 and 424. The conductive layer substantially fills the trenches 422 and 424. The conductive layer can include any of the materials described with respect to the conductive layer used to form the conductive structures 522 and 524. The conductive layer for the conductive structure 722 can have substantially the same or a different composition as compared to the conductive layer for the conductive structures 522 and 524. A portion of the conductive layer is removed outside the trenches 422 and 424. The removal can be performed using a chemical-mechanical polishing or blanket etching technique. A portion of the conductive layer is further recessed into the trenches 422 and 424. Within the trench 422, a remaining portion of the conductive layer forms the conductive structure 722, and within the trench 424, substantially all of the conductive layer is removed. The uppermost portions of the conductive structures 524 and 722 may lie at elevations near an elevation of the primary surface. In a particular embodiment, the elevations of the conductive structures 524 and 722 are within approximately 0.2 micron or within approximately 0.1 micron of the elevation of the primary surface 105. In another embodiment, the difference in elevations may be greater.

An insulating layer can be formed over the insulating portion 602, the insulating layer 202, and the conductive structures 524 and 722. The insulating layer can include any of the materials as described with respect to the insulating layer 202. The insulating layer can have substantially the same or a different composition as compared to the insulating layer 202. The insulating layer can include a single film or a plurality of films. In a particular embodiment, the insulating layer is formed by depositing a single film of oxide. In another embodiment, wherein the conductive structure 524, 722, or both include a semiconductor material, a thermal oxidation may be performed to grow a thermal oxide film before depositing an oxide film. After reading the specification, skilled artisans will be able to determine the number and composition of the insulating film(s) for their particular application.

The portion of insulating layer lying outside the openings for the conductive structures 524 and 722 is removed to form the insulating plugs 742. The removal may use either a polish or etchback technique. During the removal, a portion of the insulating portion 602 lying outside the openings and, if present, a portion of the insulating layer 202 overlying the stopping layer 108 are removed. The stopping layer 108 may be used for endpoint detection. The polishing or etching may be continued for a relatively short time after the stopping layer 108 is exposed.

Figure 8:
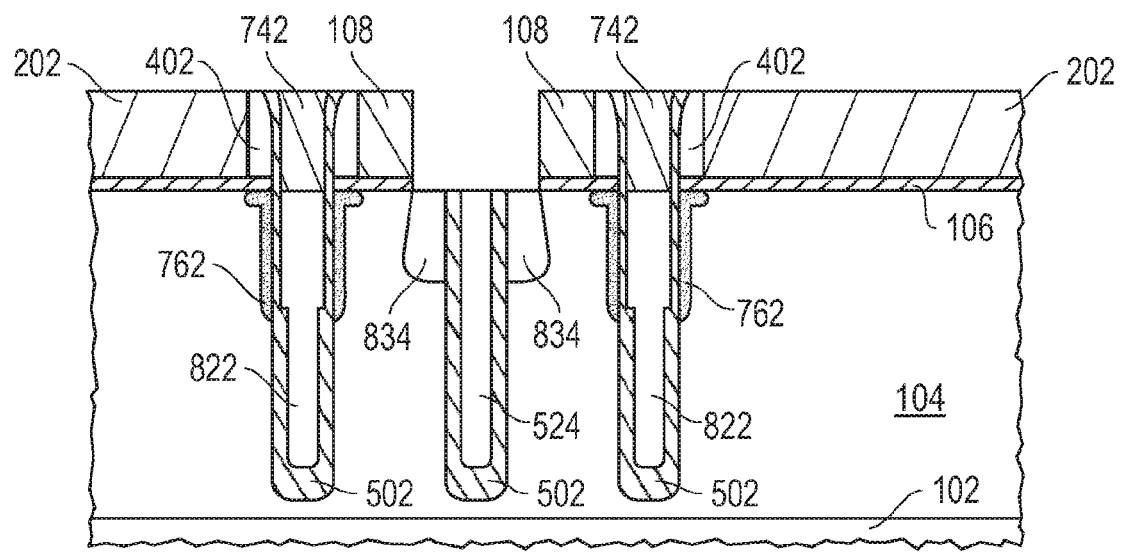
FIG. 8 includes an illustration of a cross-sectional view of the workpiece of FIG. 7 after forming a body region.

In FIG. 8, insulating layers between portions of the stopping layer 108 are removed and a body region 834 is formed. The combination of the conductive structures 522 and 722, as illustrated in FIG. 7 are represented in FIG. 8 and subsequent figures by conductive structure 822. As illustrated, the conductive structure 822 has a relatively narrower and deeper portion, formerly represented by conductive structure 522, that is disposed closer to the underlying doped region 102 as compared to a relatively wider and shallower portion, formerly represented by conductive structure 722. Thus, the conductive structure 822 has an upper portion that is relatively wider than the lower portion, and the upper portion is relatively shallower than the lower portion. Unlike the conductive structure 822, the conductive structure 524 has a substantially uniform width. Each of the conductive structures 822 and 524 extend at least approximately 50%, at least approximately 70%, or at least approximately 80% of the depth of its corresponding trench.

A patterned resist layer (not illustrated) is formed over the workpiece and defines an opening that exposes the sidewall spacer 402, the insulating layer 502, the insulating portion 602, and insulating plug 742 near the center of FIG. 7. The pad layer 106, the sidewall spacer 402, the insulating layer 502, the insulating portion 602, and insulating plug 742 disposed between portions of the stopping layer 108 are etched to expose the semiconductor layer 104. The patterned resist layer is removed. FIG. 8 includes an illustration after the etching is performed.

FIG. 8 further includes a body region 834 that can reduce the likelihood of punchthrough between the source and drain of the transistor structure. The body region 834 has the same conductivity type as the subsequently-formed channel region 1402 and has a peak dopant concentration in a range of approximately 1×10$^{17}$ atoms/cm$^3$ to approximately 1×10$^{18}$ atoms/cm$^3$. The body region 834 has a depth in a range of approximately 0.5 micron to approximately 1.2 microns. In another embodiment, the depth of the body region 834 may be shallower or deeper. If needed or desired, the pad layer 106 or a relatively thin insulating layer, such as a thermal oxide may be used as an implant screen. After forming the body region 834, the stopping layer 108 and a portion of the pad layer 106 underlying the stopping layer 108 can be removed.

Figure 9:
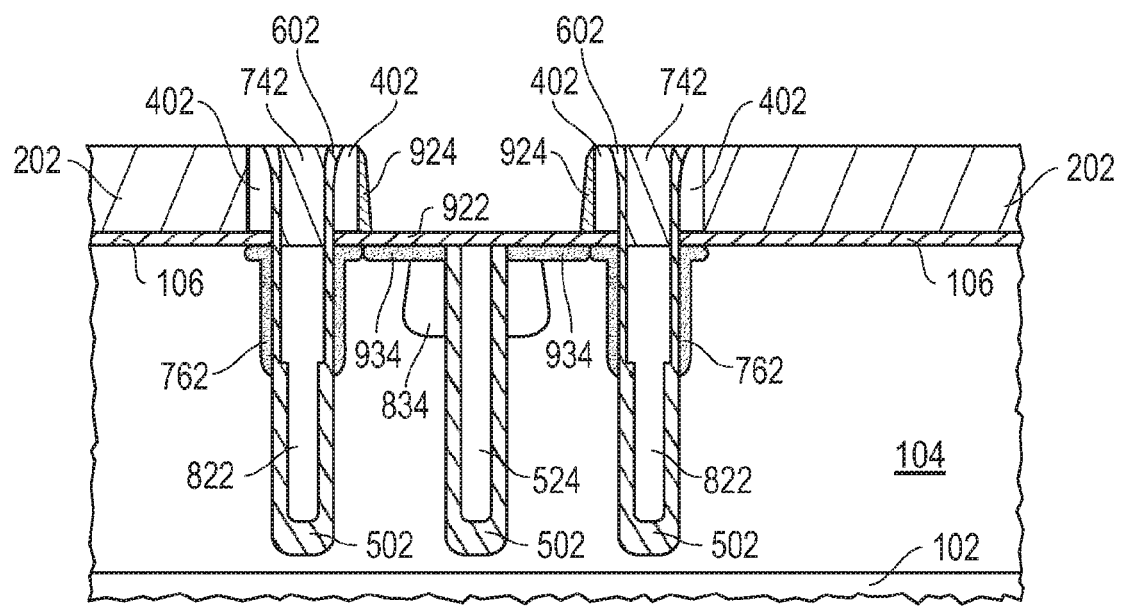
FIG. 9 includes an illustration of a cross-sectional view of the workpiece of FIG. 8 after forming a sidewall spacer and a channel doped region.

In FIG. 9, an implant screen layer 922, a sacrificial sidewall spacer 924, and a channel doped region 934 are formed. The implant screen layer 922 can be used to reduce implant channeling when forming the channel doped region 934. The implant screen layer 922 can include any of the materials as described with respect to the insulating layer 202. The implant screen layer 922 can have substantially the same or a different composition as compared to the insulating layer 202. The implant screen can have a thickness in a range of approximately 5 nm to approximately 20 nm.

The sacrificial sidewall spacer 924 is formed to provide a lateral offset between the edge of the sidewall spacer 402 and the doped region 762 (as seen from a top view), so that a subsequently-formed gate member overlies part of the doped region 762, which is part of the drain region of the transistor structure being formed. The width of the sacrificial sidewall spacer 924 at its base substantially corresponds to the thickness of the layer deposited to form the sacrificial sidewall spacer 924. The thickness of the deposited layer lies in a range of approximately 5 nm to approximately 50 nm. The deposited layer is anisotropically etched to form the sacrificial spacer 924. The sacrificial sidewall spacer 924 can have a substantially different composition compared to the implant screen layer 922 so that the implant screen layer 922 is not completely removed during formation of the sacrificial sidewall spacer 924. In an embodiment, the sacrificial sidewall spacer 924 can include a semiconductor material (for example, polycrystalline or amorphous silicon) or a nitride when the implant screen layer 922 includes an oxide.

The channel doped region 934 is formed such that the transistor being formed will have a designed or otherwise desired threshold voltage. The channel doped region 934 has a conductivity type opposite that of the doped region 762 and a peak dopant concentration in a range of approximately $5 \times 10^{16}$ atoms/cm$^3$ to approximately $2 \times 10^{18}$ atoms/cm$^3$. In a particular embodiment, the channel doped region 934 is formed by ion implantation. The sacrificial sidewall spacer 924 and the implant screen layer 922 can be removed.

Figure 10:
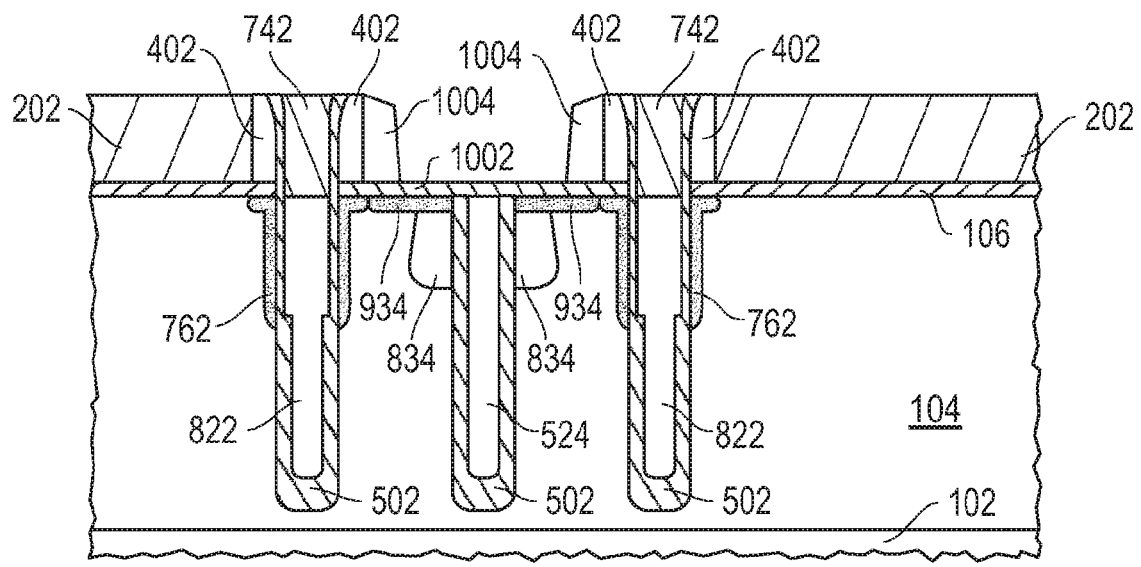
FIG. 10 includes an illustration of a cross-sectional view of the workpiece of FIG. 9 after forming a gate dielectric layer and a gate member.

In FIG. 10, a gate dielectric layer 1002 and a gate member 1004 are formed. The gate dielectric layer 1002 can include a single film or a plurality of films. The single film or a film within the plurality of films includes an oxide. The gate dielectric layer has a thickness in a range of approximately 3 nm to approximately 50 nm and can be formed by a thermal growth or deposition technique. From a top view, the gate member 1004 is not disposed over the vertically-oriented doped regions 622 (FIG. 6) of the doped region 762, the conductive structures 524 and 822, or trenches in which the conductive structures 524 and 822 are formed. The gate member 1004 can be formed by depositing a conductive layer and anisotropically etching the conductive layer. The conductive layer for the gate member 1004 can include any of the materials described with respect to the conductive layer for the conductive structure 524. The conductive layer for the gate member 1004 can have substantially the same or a different composition as compared to the conductive structure 524. In an embodiment, the conductive layer has a thickness of at least approximately 100 nm or a least approximately 200 nm, and in another embodiment, the conductive layer has a thickness no greater than approximately 1000 nm or no greater than approximately 700 nm. After depositing the conductive layer, it is anisotropically etched to form the gate member 1004 that has a shape of a sidewall spacer. In a particular embodiment, the gate member 1004 does not overlie the conductive structure 822 or 524. The gate member 1004 may be thermally oxidized to form a thin insulating layer (not illustrated) along the exposed surfaces of the gate member 1004.

Figure 11:
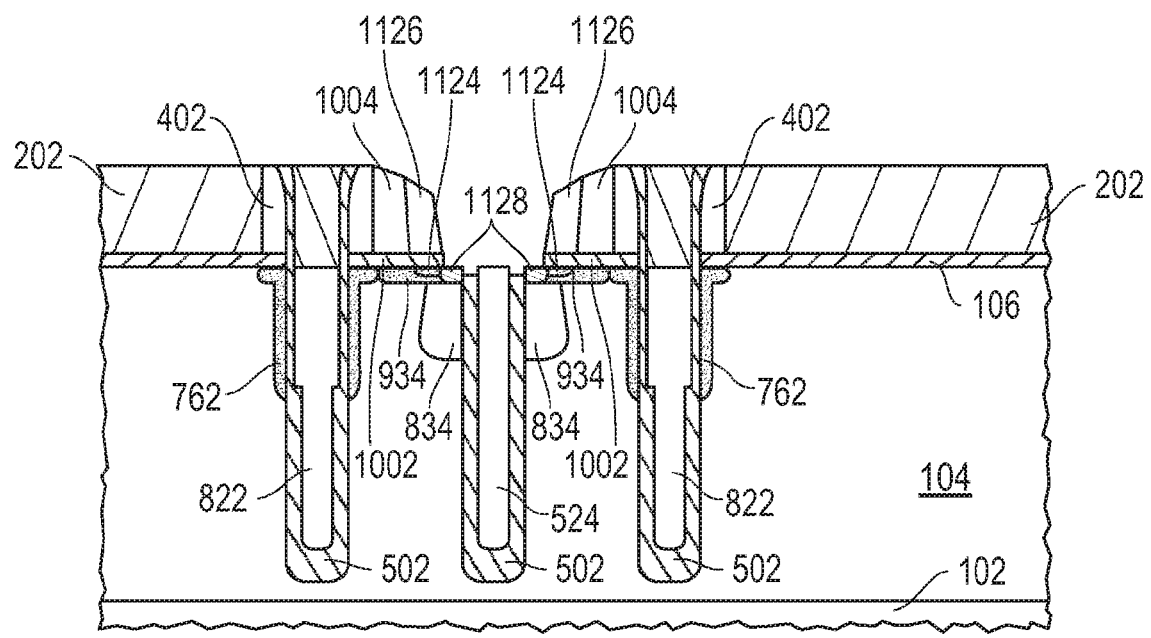
FIG. 11 includes an illustration of a cross-sectional view of the workpiece of FIG. 10 after forming a source region.

In FIG. 11, lightly doped source region 1124, an insulating sidewall spacer 1126, and a heavily doped source region 1128 are formed. The lightly doped source region 1124 can have a dopant conductivity type that is the same as the doped region 762. The lightly doped source region 1124 can have substantially the same or a different peak dopant concentration, substantially the same or a different depth, and substantially the same or a different formation condition as compared to the doped regions 302 and 304. In a particular embodiment, the peak dopant concentration of the lightly doped source region 1124 may be greater than the peak dopant concentration of doped regions 302 and 304, and may also be less than the peak dopant concentration of the heavily doped source region 1128. The width of the insulating sidewall spacer 1126 is substantially the same as the dimension that the lightly doped source region extends beyond the heavily doped source region 1128. The insulating sidewall spacer 1126 can be formed by depositing and anisotropically etching an insulating layer. The insulation layer for the insulating sidewall spacer 1126 can include any of the materials as described with respect to the insulating layer 202. The insulating layer for the insulating sidewall spacer 1126 and the insulating layer 202 can have substantially the same composition or a different composition. The thickness of the insulating layer for the insulating sidewall spacer 1126 corresponds to the width of the insulating sidewall spacer 1126 measured at its base. The thickness is in a range of approximately 20 nm to approximately 150 nm.

The heavily doped source region 1128 can be formed after the insulating sidewall spacer 1126 is formed. The heavily doped source region 1128 has a dopant conductivity type that is the same as the lightly doped source region 1124. The heavily doped source region 1128 can have a peak dopant concentration of at least $1 \times 10^{19}$ atoms/cm$^3$, a depth in a range of approximately 0.05 micron to approximately 0.3 micron, and formed using $^{75}$As$^+$ ions at an energy in a range of approximately 5 keV to approximately 130 keV and a dose in a range of approximately $1 \times 10^{15}$ to $1 \times 10^{16}$ ions/cm$^2$. The gate member 1004 and the heavily doped source region 1128 may be silicided if needed or desired. In another embodiment, a different concentration, depth, implant energy or dose may be used. In still another embodiment, the formation order may be changed. For example, the insulating sidewall spacer 1126 and heavily doped source region 1128 may be formed, followed by removal of the insulating sidewall spacer 1126 and formation of the lightly doped source region 1124. The insulating sidewall spacer 1126 can include a material that can be removed selectively to the other exposed insulating materials and the gate member 1004.

Figure 12:
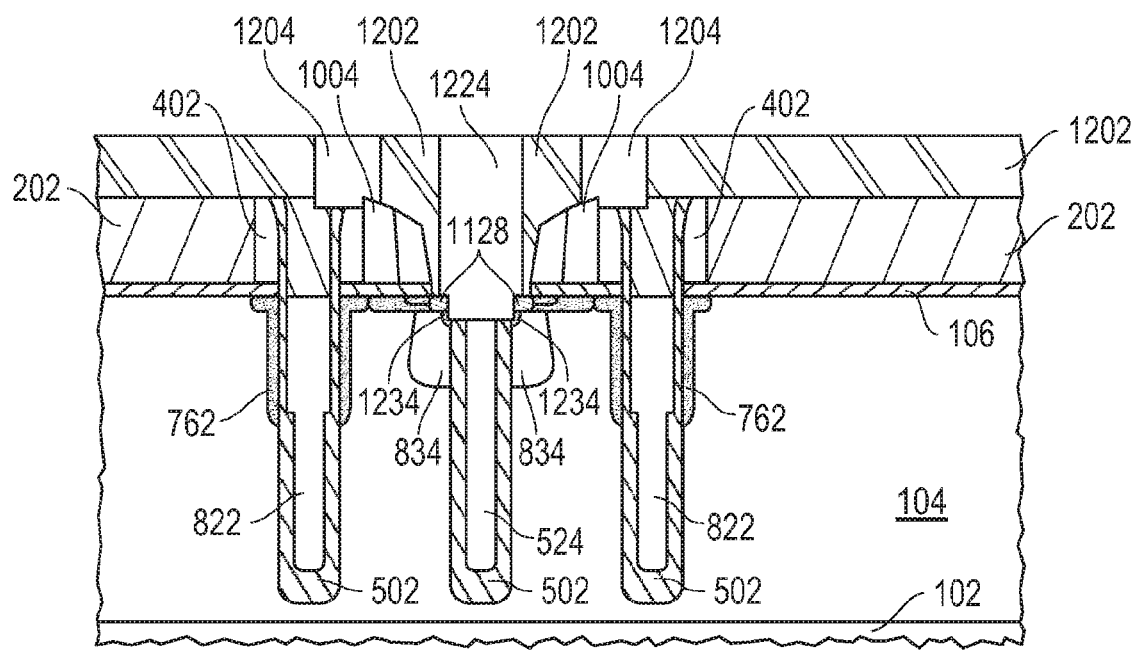
FIG. 12 includes an illustration of a cross-sectional view of the workpiece of FIG. 11 after forming an interlevel dielectric layer, a body contact region, and conductive plugs.

In FIG. 12, an interlevel dielectric (ILD) layer 1202, body contact region 1234, and conductive plugs 1204 and 1224 are formed. An insulating layer 1202 is formed over the workpiece. The ILD layer 1202 can include an oxide, a nitride, an oxynitride, or any combination thereof. The ILD layer 1202 can include a single film having a substantially constant or changing composition (e.g., a high phosphorus content further from the semiconductor layer 104) or a plurality of discrete films. An etch-stop layer, an antireflective layer, or a combination may be used within or over the ILD layer 1202 to help with processing. The ILD layer 1202 may be planarized to improve process margin during subsequent processing operations (e.g., lithography, subsequent polishing, or the like). In an embodiment, the ILD layer 1202 has a thickness of at least approximately 300 nm or at least approximately 500 nm, and in another embodiment, the ILD layer 1202 has a thickness no greater than approximately 1000 nm or no greater than approximately 800 nm. The ILD layer 1202 can be planarized using an etchback or polishing technique.

The ILD layer 1202 is patterned to define contact openings that extend through the ILD layer 1202. The contact openings for different parts of the transistors may be formed with one or more etch sequences. For example, contact openings for the gate member 1004, contact openings for the conductive structures 822, and contact openings for the heavily doped source region 1128, body contact region 1234, and conductive structure 524 may be formed at the different times. In one embodiment, the contact openings for the gate members 1004 may be formed such that the contact opening exposes the sidewall spacer structure of the gate member 1004. Separately, a contact etch can be performed such that a contact opening to the source is extended through the heavily doped source region 1128 to the body region 834. The etch is continued to extend through the heavily doped source region 1128 and ends within the body region 834. The etch can be performed as a timed etch or as an endpoint detected etch with a timed overetch. The first endpoint may be detected when the heavily doped source region 1128 becomes exposed, and a second endpoint may be detected by the presence of dopant from the body region 834 in a particular embodiment. A body contact region 1234 is formed by doping the bottom part of the contact opening. The body contact region 1234 may be implanted with a dopant having the same conductivity type as the body region 834 in which it resides. The body contact region 1234 is heavily doped so that an ohmic contact can be subsequently formed. If needed or desired exposed portions of the regions, structures, and members may be silicided.

Conductive plugs 1204 and 1224 are formed by depositing a conductive layer and etching portions of the conductive layer outside the contact openings. The conductive layer for the conductive plugs 1204 and 1224 can include any of the materials, films, or both as described with respect to the conductive layer for the conductive structure 524, such as a metal-containing material. In an embodiment, the conductive layer for the conductive plugs 1204 and 1224 has substantially the same composition and same number of films as compared to the conductive structure 524. In another embodiment, the conductive layer for the conductive plugs 1204 and 1224 has a different composition or a different number of films as compared to the conductive structure 524. After removing portions of the conductive layer lying outside the contact openings, the conductive plugs 1204 and 1224 are formed. Other conductive plugs are formed but are not illustrated in FIG. 12. For example, a conductive plug contacts the conductive structure 822.

Subsequent processing is performed to form a substantially completed electronic device. An interconnect level can be formed and include an interconnect member that is electrically connected to the conductive plug 1224, the conductive structure 822, and a source terminal for the transistor structure; and another interconnect member that is electrically connected to the conductive plug 1204 and a gate terminal for the transistor structure. In an embodiment, each of the conductive structures 524 and 822 can be electrically connected to a substantially constant voltage, and in a particular embodiment, the conductive structures 524 and 822 are electrically connected to the source region 1128 and the source terminal for the electronic device. The electronic device can include many transistor structures substantially similar to the transistor illustrated in FIG. 12 with the transistor structures connected in parallel with their corresponding gate members connected to the gate terminal. All of the transistor structures can be power transistors.

Many other embodiments may be used consistent with the concepts as described herein. The conductive structure 524 is not required. If the conductive structure 524 is not to be formed, the member of the stopping layer 108 may not have an opening near the center as illustrated in FIG. 1. The doped region 304, the trench 424, insulating layer 502 within the trench 424, and conductive structure 524 would not be formed. Note that the doped region 302, trench 422, insulating layer 502 within the trench 422, and the conductive structured 522 and 722 are formed as previously described. Referring to FIG. 8, the stopping layer 108 would be patterned to remove the center portion before the body region 834 is formed. The process flow continues as describe starting with the formation of the body region 834.

Figure 13:
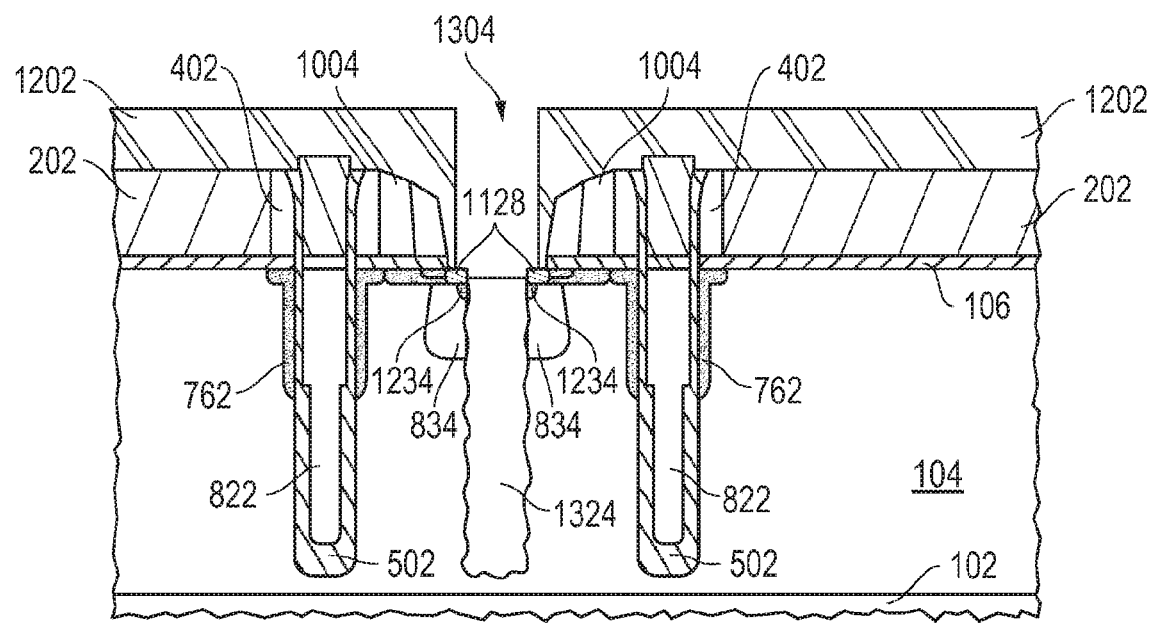
FIG. 13 includes an illustration of a cross-sectional view of a portion of a workpiece where a superjunction is formed in accordance with an alternative embodiment.

In another embodiment, the conductive structure 524 may be replaced by a superjunction 1324, as illustrated in FIG. 13. The ILD layer 1202 can be patterned to define an opening 1304. In a particular embodiment, a plurality of implants may be performed to form the superjunction 1324. The width and peak dopant concentration within the superjunction 1324 may be selected to keep the total change within the superjunction 1324 relatively constant. The peak dopant concentration within the superjunction 1324 may be approximately $1 \times 10^{16}$ atoms/cm$^3$ at a particular width and be approximately $7 \times 10^{16}$ atoms/cm$^3$ at another width that is 1/7 of the particular width. The superjunction may extend into the semiconductor layer 104 to any of the depths that are previously described with respect to the trench 424. In a particular embodiment, the superjunction 1324 may be spaced part from the underlying doped region 102 to provide a higher breakdown voltage than if the superjunction 1324 would contact the underlying doped region 102. Processing would continue as previously described with respect to FIG. 12 regarding further patterning of the ILD layer 1202 and formation of conductive plugs and interconnect members.

In another embodiment (not illustrated), an optional implant may be performed to increase the dopant concentration of the drain region immediately adjacent to the channel region. Referring to FIG. 9, a sacrificial member may be formed between the sacrificial spacers 924. The material of the sacrificial member is different from the sacrificial spacers 924. The sacrificial spacers 924 are removed selectively to the sacrificial member. A doped region can be formed within the semiconductor layer 104 at a location that was previously covered by the sacrificial spacers 924. In a particular embodiment, the dopant concentration of the doped regions is in a range of approximately 2 to approximately 5 times a dopant concentration of the doped region 302. In another particular embodiment when implantation is used, the dose may be in a range of approximately $2 \times 10^{12}$ ions/cm$^2$ to approximately $2 \times 10^{13}$ ions/cm$^2$. The depths of the newly-formed doped region may not be more than approximately 0.2 micron deeper than the doped region 302. After the doped regions are formed, the sacrificial member can be removed. More details regarding the doping and processing details can be found in US 2011/0193143, which is incorporated herein by reference regarding the formation of the sacrificial spacers 1102, sacrificial members 1122, and doped regions 1222 in such patent publication.

In a further embodiment, the process may be modified to form the gate member using a photolithographic operation and form the vertically-oriented doped regions using a series of implants. Referring to FIG. 5, the conductive structures 522 and 524 can be further etched such that the uppermost part of the conductive structures 522 and 524 are at about the same elevation of the uppermost surface of the semiconductor layer 104. All of the features above the semiconductor layer 104 are removed. Portions of the insulating layer 502 near the edge of the trenches 422 and 424 are removed.

Figure 14:
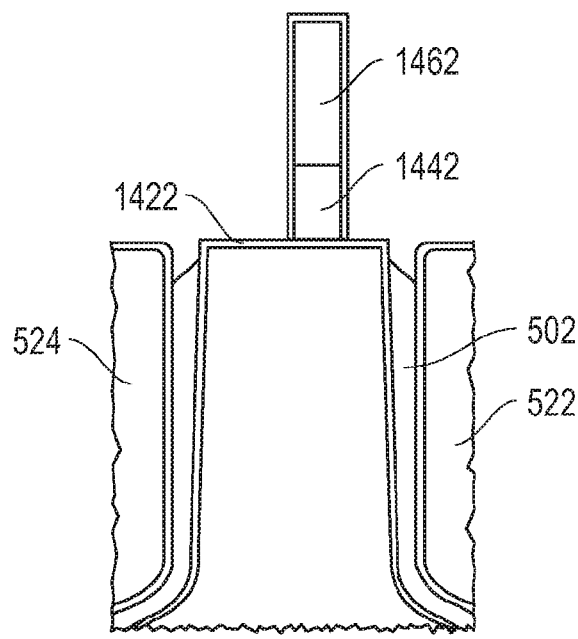
FIG. 14 includes an illustration of a cross-sectional view of a portion of a workpiece including a semiconductor layer, an insulating layer, conductive plugs, a gate member, and an insulating member.

In FIG. 14, a gate dielectric layer 1422 is formed using any of the materials, thicknesses, and formation technique as described with respect to the gate dielectric layer 1002. The conductive layer for the gate member is formed over the gate dielectric layer 1422. The conductive layer can include any of the materials described with respect to the conductive layer for the conductive structure 524. In an embodiment, the conductive layer has a thickness of at least approximately 200 nm or a least approximately 300 nm, and in another embodiment, the conductive layer has a thickness no greater than approximately 1000 nm or no greater than approximately 800 nm. An insulating layer is formed over the conductive layer. The insulating layer can include a plurality of films similar to the ILD layer 1202. The insulating layer has a thickness in a range of approximately 300 nm to approximately 800 nm. The insulating layer may be grown or deposited or may include a film that is grown and another film that is deposited.

A patterned organic resist layer is formed over the conductive and insulating layers. The insulating layer is etched to form an insulating member 1462, and the conductive layer is etched to form the gate member 1442 that includes a gate electrode for the transistor structure being formed. In an embodiment, each of the gate member 1442 and insulating member 1462 has a width of at least approximately 0.15 microns or a least approximately 0.2 microns, and in another embodiment, each of the gate member 1442 and insulating member 1462 has a width no greater than approximately 1.0 microns or no greater than approximately 0.8 microns.

Figure 15:
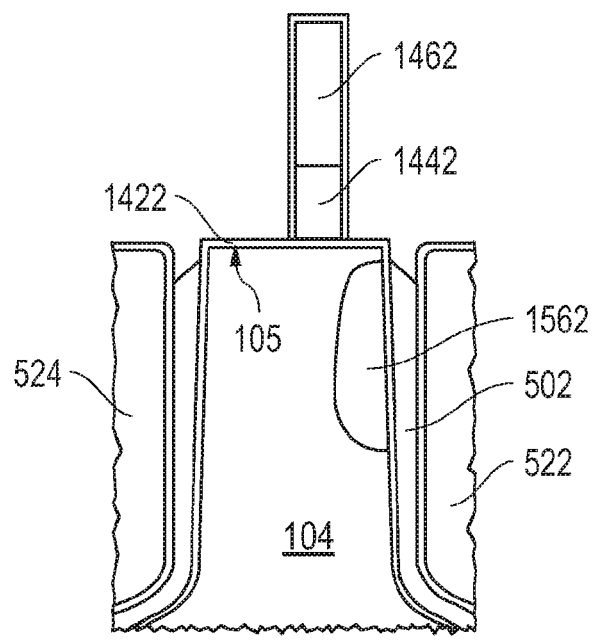
FIG. 15 includes an illustration of a cross-sectional view of the workpiece of FIG. 15 after forming a vertically-oriented doped region.

FIG. 15 includes an illustration of the workpiece after forming a vertically-oriented doped region 1562. A patterned resist layer (not illustrated) is formed over the workpiece so that dopant enters the semiconductor layer 104 to the right of the gate and insulating members 1442 and 1462. If the gate and insulating members 1442 and 1462 are sufficiently thick as to block the implant to form the doped region 1562, the patterned resist layer may not overlie the gate and insulating members 1442 and 1462; otherwise, the patterned resist layer overlies the gate and insulating members 1442 and 1462. A series of implants may be performed to form the vertically-oriented doped region 1562. The vertically-oriented doped region 1562 can have any of the doping concentrations and depths as previously described with respect to the vertically-oriented doped region 762. Unlike the vertically-oriented doped region 762, the vertically-oriented doped region 1562 may be formed using a tilt angle as small as 0°. Further, the uppermost portion of the vertically-oriented doped region 1562 may be spaced apart from the primary surface 105 of the semiconductor layer 104. The patterned resist layer can then be removed.

Figure 16:
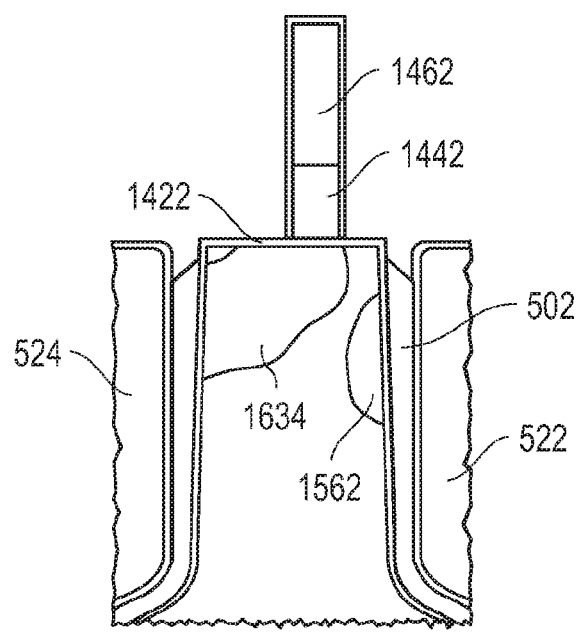
FIG. 16 includes an illustration of a cross-sectional view of the workpiece of FIG. 15 after forming a body region.

FIG. 16 includes an illustration of the workpiece after forming a body region 1634. A patterned resist layer (not illustrated) is formed over the workpiece so that dopant enters the semiconductor layer 104 to the left of and under the gate and insulating members 1442 and 1462. A series of implants may be performed to form the body region 1634. The body region 1634 can have any of the doping concentrations and depths as previously described with respect to the body region 834. Unlike the body region 834, the body region 1634 may be formed using a tilt angle and energy sufficient to implant dopant under the gate member 1442, as some of the body region 1634 will also be the channel region for the transistor structure being formed. In an embodiment, the tilt angle is at least approximately 30° or at least approximately 35°, and in another embodiment, the tilt angle is no greater than approximately 45° or no greater than approximately 40°. In a particular embodiment $^{11}B^+$ is implanted. In another embodiment, another dopant may be used, and the energy can be adjusted to achieve the desired depth.

Figure 17:
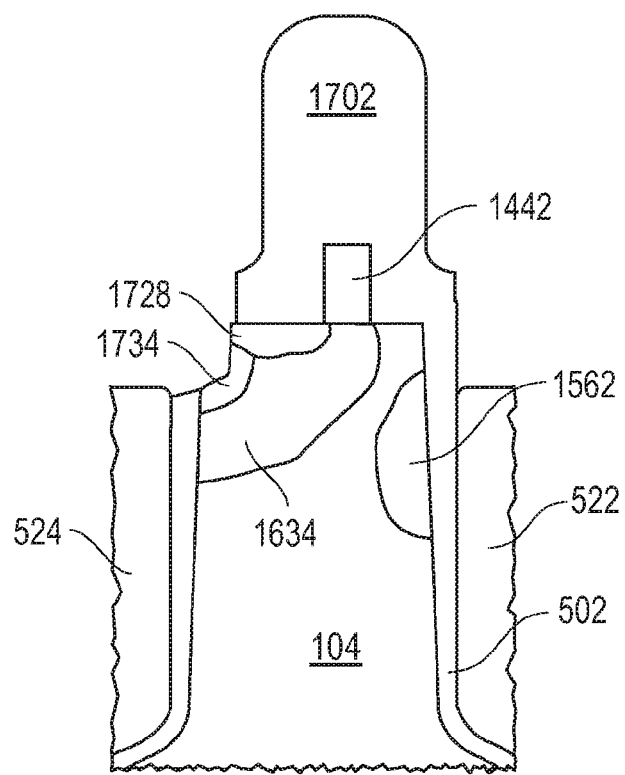
FIG. 17 includes an illustration of a cross-sectional view of a substantially completed electronic device in accordance with another alternative embodiment.

Processing can continue in a manner similar to that previously described to form a substantially-completed transistor structure, as illustrated in FIG. 17. The transistor structure includes a source region 1728, a body contact region 1734, and a patterned insulating layer 1702. Such features can be made using any of the materials, dopants and doping concentrations, depths, thicknesses, number of films, and etching techniques as previously described An electronic device that includes a transistor structure as described herein can have a lateral channel region and a vertically-oriented doped region on a drain side of the channel region adjacent to a trench. A conductive plug within the trench or superjunction can provide for depletion in the drain side, the source side, or both the drain side and source side of the channel region. A thicker portion of an insulating layer, such as the insulating layer 502, allows for a desired $BV_{DSS}$ for the transistor structure to be achieved, and when even thicker, can reduce capacitive coupling between the underlying doped region 102 and the conductive structures 822 and 524. Further, the formation of the transistor structure leverages self-aligned processing and reduces potential misalignment errors. According, features do not need to be as large to account for potential misalignment, and the transistor cell may have a smaller pitch. An electronic device can be formed having a smaller $R_{DSON}$*Area and a lower figure of merit as compared to other electronic devices operating at the same gate and drain voltages. Therefore, the performance of the electronic device is significantly improved.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a semiconductor layer overlying a substrate and having a primary surface and a thickness, wherein a first trench extends through at least approximately 50% of the thickness of semiconductor layer to a first depth. The electronic device can further include a first conductive structure within the first trench, wherein the first conductive structure extends at least approximately 50% of the first depth of the first trench. The electronic device can still further include a vertically-oriented doped region within the semiconductor layer adjacent to and electrically insulated from the first conductive structure. The electronic device can yet further include a first insulating layer disposed between the vertically-oriented doped region and the first conductive structure.

In an embodiment of the first aspect, other than rounding at a bottom of the first trench, the first trench has a substantially uniform width, and the vertically-oriented doped region is immediately adjacent to the first trench. In another embodiment, the vertically-oriented doped region extends to a second depth that is at least approximately 20% of thickness of the semiconductor layer. In yet another embodiment, the electronic device further includes a channel region having a corresponding channel length that extends in a direction substantially parallel to the primary surface of the semiconductor layer.

In a further embodiment of the first aspect, the electronic device further includes a second trench that extends through at least approximately 50% of the thickness of semiconductor layer, wherein the second trench spaced-apart from the first trench; and a second conductive structure within the second trench, wherein the second conductive structure extends through at least approximately 50% of the thickness semiconductor layer. The electronic device further includes a source region outside of and adjacent to the second trench, wherein the source region is spaced apart from the vertically oriented doped region by a channel region; and a second insulating layer disposed between the source region and the second conductive structure. In a particular embodiment, the second conductive structure has a substantially uniform width, and the first conductive structure has a first portion with a first width and a second portion with a second width different from the first width. In another particular embodiment, the first insulating layer is significantly thicker along a bottom of the first trench compared to any other portion of the first insulating layer along a sidewall of the first trench, the second insulating layer is significantly thicker along a bottom of the second trench compared to any other portion of the second insulating layer along a sidewall of the second trench or any combination thereof.

In another embodiment of the first aspect, the electronic device further includes an underlying doped region spaced apart from the primary surface and underlying the channel region, wherein the underlying doped region is part of a drain region, is coupled to the vertically-oriented doped region, and is electrically insulated from the first conductive structure. In a particular embodiment, the electronic device further includes a body region that includes a channel region, and a superjunction extending below the body region towards the underlying doped region. In still another embodiment, the first conductive structure includes a first portion and a second portion disposed over the first portion, the first portion is farther from the primary surface of the semiconductor layer as compared to the second portion, and the first portion is narrower and deeper than the second portion. In yet another embodiment, the electronic device further includes a gate member that does not directly overlie the first trench.

In a second aspect, a process of forming an electronic device can include forming a semiconductor layer over a substrate, wherein the semiconductor layer has a primary surface and a thickness. The process can further include patterning the semiconductor layer to define a first trench extending through at least approximately 50% of the thickness of the semiconductor layer, and forming a first insulating layer within the first trench. The process can still further include forming a vertically-oriented doped region within the semiconductor layer and extending from near the primary surface towards the substrate, wherein the vertically-oriented doped region is formed after patterning the semiconductor layer to define the first trench. The process can yet further include forming a first conductive structure within the first trench, wherein the first insulating layer is disposed between the semiconductor layer and the first conductive structure.

In an embodiment of the second aspect, patterning the semiconductor layer is performed such that, other than rounding at a bottom of the first trench, the first trench has a substantially uniform width. In another embodiment, forming the first conductive structure includes filling a first portion of the first trench with a first conductive fill material, removing a portion, but not all, of the first insulating layer within the first trench after filling the first portion of the trench with the first conductive fill material, and filling a second portion of the trench with a second conductive fill material after removing a portion, but not all, of the first insulating layer. In still another embodiment, forming the vertically-oriented doped region and forming the first conductive structure include filling the first trench with a first conductive fill material, removing a portion, but not all, of the first conductive fill material, forming the vertically-oriented doped region after removing the portion of the first conductive fill material, and filling a second portion of the first trench with a second conductive fill material after forming the vertically-oriented doped region.

In a further embodiment of the second aspect, the process further includes forming a gate electrode layer, and anisotropically etching the gate electrode layer to form a gate member, wherein anisotropically etching removes substantially an entire thickness of the gate electrode layer from over a portion of the first conductive structure. In a particular embodiment, the process further includes forming a patterned resist layer over the gate electrode layer, wherein anisotropically etching is performed while the resist layer overlies the gate electrode layer.

In another embodiment of the second aspect, the process further includes patterning the semiconductor layer to define a second trench that extends through at least approximately 50% of the thickness of semiconductor layer, wherein the second trench is spaced-apart from the first trench, forming a second insulating layer within the second trench, forming a second conductive structure within the second trench after forming the second insulating layer, and forming a source region outside of and adjacent to the second trench, wherein the source region is spaced apart from the vertically-oriented doped region by a channel region. In a particular embodiment, forming the first insulating layer includes forming a first insulating film within the first and second trenches, and forming a second insulating film within the first and second trenches after forming the first insulating film, and removing a portion, but not all, of the first insulating layer includes selectively etching the second insulating film in preference to the first insulating film within the first trench, and not etching a significant amount of the second insulating film within the second trench. In another particular embodiment, forming the vertically-oriented doped region, forming the first conductive structure, and forming the second conductive structure include: filling the first and second trenches with a first conductive fill material; removing a portion, but not all, of the first conductive fill material from within the first trench, and not removing a significant portion of the first conductive fill material from the second trench; forming the vertically-oriented doped region immediately adjacent to a sidewall of the first trench after removing the portion of the first conductive fill material, wherein no vertically-oriented doped region is formed immediately adjacent to a sidewall of the second trench; and filling a second portion of the first trench with a second conductive fill material after forming the vertically-oriented doped region.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
  a semiconductor layer overlying a substrate and having a primary surface and a thickness, wherein a first trench extends through at least approximately 50% of the thickness of the semiconductor layer to a first depth;
  a first conductive structure within the first trench, wherein the first conductive structure extends at least approximately 50% of the first depth of the first trench;

a vertically-oriented doped region within the semiconductor layer adjacent to and electrically insulated from the first conductive structure;
a first insulating layer disposed between the vertically-oriented doped region and the first conductive structure; and
a gate member substantially overlying the primary surface of the semiconductor layer.

2. The electronic device of claim 1, wherein:
other than rounding at a bottom of the first trench, the first trench has a substantially uniform width; and
the vertically-oriented doped region is immediately adjacent to the first trench.

3. The electronic device of claim 1, wherein the vertically-oriented doped region extends to a second depth that is at least approximately 20% of thickness of the semiconductor layer.

4. The electronic device of claim 1, further comprising a channel region having a corresponding channel length that extends in a direction substantially parallel to the primary surface of the semiconductor layer.

5. The electronic device of claim 1, further comprising:
a second trench that extends through at least approximately 50% of the thickness of the semiconductor layer, wherein the second trench is spaced-apart from the first trench;
a second conductive structure within the second trench, wherein the second conductive structure extends through at least approximately 50% of the thickness of the semiconductor layer;
a source region outside of and adjacent to the second trench, wherein the source region is spaced apart from the vertically oriented doped region by a channel region; and
a second insulating layer disposed between the source region and the second conductive structure.

6. The electronic device of claim 5, wherein the second conductive structure has a substantially uniform width, and the first conductive structure has a first portion with a first width and a second portion with a second width different from the first width.

7. The electronic device of claim 5, wherein:
the first insulating layer is significantly thicker along a bottom of the first trench compared to any other portion of the first insulating layer along a sidewall of the first trench;
the second insulating layer is significantly thicker along a bottom of the second trench compared to any other portion of the second insulating layer along a sidewall of the second trench; or
any combination thereof.

8. The electronic device of claim 4, further comprising an underlying doped region spaced apart from the primary surface and underlying the channel region, wherein the underlying doped region is part of a drain region, is coupled to the vertically-oriented doped region, and is electrically insulated from the first conductive structure.

9. The electronic device of claim 8, wherein the semiconductor layer has a relatively uniform dopant concentration as measured between the underlying doped region and a bottom portion of the first insulating layer.

10. The electronic device of claim 8, further comprising:
a body region that includes the channel region; and
a superjunction extending below the body region towards the underlying doped region.

11. The electronic device of claim 1, wherein:
the first conductive structure includes a first portion and a second portion disposed over the first portion;
the first portion is farther from the primary surface of the semiconductor layer as compared to the second portion; and
the first portion is narrower and deeper than the second portion.

12. The electronic device of claim 1, wherein the gate member is disposed at a location external to the first trench.

13. The electronic device of claim 1, wherein the first insulating layer has a thickness of between approximately 50 nm and approximately 300 nm.

14. An electronic device comprising:
a semiconductor layer overlying a substrate and having a primary surface and a thickness, wherein a first trench extends through at least approximately 50% of the thickness of the semiconductor layer to a first depth;
a vertically-oriented doped region disposed within the semiconductor layer and extending from near the primary surface towards the substrate, the vertically-oriented doped region is positioned adjacent to the first trench;
a first conductive structure disposed within the first trench;
a first insulating layer disposed between the first conductive structure and the semiconductor layer;
a channel region adjacent to the primary surface of the semiconductor layer; and
a gate member that substantially overlies the primary surface of the semiconductor layer.

15. The electronic device of claim 14, further comprising an underlying doped region spaced apart from the primary surface and underlying the channel region, wherein the underlying doped region is part of a drain region, is coupled to the vertically-oriented doped region, and is electrically insulated from the first conductive structure.

16. The electronic device of claim 14, further comprising:
a second trench that extends through at least approximately 50% of the thickness of the semiconductor layer, wherein the second trench is spaced-apart from the first trench;
a second conductive structure within the second trench;
a source region outside of and adjacent to the second trench, wherein the source region is spaced apart from the vertically oriented doped region by the channel region; and
a second insulating layer disposed between the source region and the second conductive structure.

17. The electronic device of claim 14, wherein:
other than rounding at a bottom of the first trench, the first trench has a substantially uniform width; and
the vertically-oriented doped region is immediately adjacent to the first trench.

18. The electronic device of claim 14, wherein the channel region has a corresponding channel length that extends in a direction substantially parallel to the primary surface of the semiconductor layer.

19. An electronic device comprising:
a semiconductor layer overlying a substrate and having a primary surface and a thickness, wherein a first trench and a second trench extend through at least approximately 50% of the thickness of the semiconductor layer to a first depth;
a first conductive structure within the first trench, wherein the first conductive structure extends at least approximately 50% of the first depth of the first trench;

a second conductive structure within the second trench, wherein the second conductive structure extends through at least approximately 50% of the thickness of the semiconductor layer;

a vertically-oriented doped region within the semiconductor layer adjacent to and electrically insulated from the first conductive structure;

a first insulating layer disposed between the vertically-oriented doped region and the first conductive structure;

a source region outside of and adjacent to the second trench, wherein the source region is spaced apart from the vertically oriented doped region by a channel region; and a second insulating layer disposed between the source region and the second conductive structure.

20. The electronic device of claim 19, further comprising an underlying doped region spaced apart from the primary surface and underlying the channel region, wherein the underlying doped region is part of a drain region, is coupled to the vertically-oriented doped region, and is electrically insulated from the first conductive structure.

\* \* \* \* \*